United States Patent
Kallaher et al.

(10) Patent No.: US 10,978,632 B2
(45) Date of Patent: *Apr. 13, 2021

(54) FABRICATION OF A DEVICE

(71) Applicant: Microsoft Technology Licensing, LLC, Redmond, WA (US)

(72) Inventors: Raymond Leonard Kallaher, West Lafayette, IN (US); Sergei Vyatcheslavovich Gronin, West Lafayette, IN (US); Geoffrey Charles Gardner, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/252,237

(22) Filed: Jan. 18, 2019

(65) Prior Publication Data
US 2020/0235275 A1 Jul. 23, 2020

(51) Int. Cl.
 *H01L 39/24* (2006.01)
 *H01L 39/22* (2006.01)
 *H01L 39/10* (2006.01)

(52) U.S. Cl.
 CPC ........ *H01L 39/2403* (2013.01); *H01L 39/228* (2013.01); *H01L 39/10* (2013.01)

(58) Field of Classification Search
None
See application file for complete search history.

(56) References Cited

U.S. PATENT DOCUMENTS

| | | |
|---|---|---|
| 9,653,286 B2 | 5/2017 | Ohlsson et al. |
| 9,934,967 B2 | 4/2018 | Hydrick et al. |
| 10,777,728 B2 | 9/2020 | Aseev et al. |
| 2012/0085991 A1 | 4/2012 | Cohen et al. |
| 2014/0335215 A1 | 11/2014 | Hayashi et al. |
| 2015/0118777 A1 | 4/2015 | Seo et al. |

(Continued)

FOREIGN PATENT DOCUMENTS

| | | |
|---|---|---|
| DE | 102017002616 | 9/2018 |
| WO | WO 2016/000836 | 1/2016 |

(Continued)

OTHER PUBLICATIONS

Brubaker et al., "Polarity-Controlled GaN/AlN Nucleation Layers for Selective-Area Growth of GaN Nanowire Arrays on Si(111) Substrates by Molecular Beam Epitaxy," Abstract Only, *Cryst. Growth Des.*, vol. 16, 2 pp. (Dec. 2015).

(Continued)

*Primary Examiner* — Mounir S Amer
(74) *Attorney, Agent, or Firm* — Klarquist Sparkman, LLP

(57) ABSTRACT

A method of fabricating a device, wherein the device comprises a plurality of lengths of material and at least one junction joining two or more of the lengths of material. In a masking phase, a mask is formed on an underlying layer of the device. The mask comprises a plurality of trenches exposing the underlying layer, each trench corresponding to one of the lengths of material. A respective section of two or more of the trenches either (a) narrow down, or (b) are separated by a discontinuity, at a position corresponding to the at least one junction. In a selective area growth phase, material is grown in the set of trenches to form the lengths of material on the underlying layer. The two or more lengths of material are joined at the at least one junction.

19 Claims, 6 Drawing Sheets

(56) References Cited

U.S. PATENT DOCUMENTS

| | | |
|---|---|---|
| 2017/0141287 A1 | 5/2017 | Barkeshli et al. |
| 2018/0166275 A1 | 6/2018 | Wang |
| 2018/0204977 A1 | 7/2018 | Dheeraj et al. |
| 2019/0355868 A1 | 11/2019 | Fimland et al. |

FOREIGN PATENT DOCUMENTS

| | | |
|---|---|---|
| WO | WO 2019/001753 | 1/2019 |
| WO | 2019099171 A2 | 5/2019 |

OTHER PUBLICATIONS

Davies et al., Abstract of "Selective area growth of III-V semiconductors by chemical beam epitaxy: study of reaction mechanisms," *Proc. SPIE Epitaxial Growth Processes*, 3 pp. (May 1994).
Fahed, "Selective area growth of in-plane III-V nanostructures using molecular beam epitaxy," Ph.D. Thesis, University of Lille, pp. 1-140 (2016).
Fukui et al., Abstract of "GaAs tetrahedral quantum dot structures fabricated using selective area metalorganic chemical vapor deposition," *Appl. Phys. Lett.*, vol. 58, 6 pp. (1991).
Gazibegovic et al., "Epitaxy of Advanced Nanowire Quantum Devices," *Nature*, vol. 548, Issue 7668, pp. 1-35 (Aug. 2017).
Hiruma et al., "Fabrication of Axial and Radial Heterostructures for Semiconductor Nanowires by Using Selective-Area Metal-Organic Vapor-Phase Epitaxy," *Journal of Nanotechnology*, pp. 1-29 (Jan. 2012).
Krizek et al., "Field effect enhancement in buffered quantum nanowire networks," *Physical Review Materials*, vol. 2, Issue 9, pp. 1-15 (Sep. 2018).
Krizek, "Semiconductor Nanowire Networks Grown by Molecular Beam Epitaxy," Ph.D. Thesis, University of Copenhagen, pp. 1-190 (Jul. 2018).
Krogstrup et al., "Epitaxy of Semiconductor-Superconductor nanowires," *Nature Materials*, pp. 1-40 (2015).
Shabani et al., "Two-dimensional epitaxial superconductor-semiconductor heterostructures: A platform for topological superconducting network," *Physical Review B*, pp. 1-13 (2016).
Zhang et al., "A review of III-V planar nanowire arrays: selective lateral VLS epitaxy and 3D transistors," *Journal of Physics D: Applied Physics*, vol. 50, No. 39, 21 pp. (Aug. 2017).
International Search Report and Written Opinion dated Apr. 8, 2020, from International Patent Application No. PCT/US2020/012285, 16 pp.
Lyu et al., "Protected gap closing in Josephson junctions constructed on $Bi_2Te_3$ surface," arXiv:1603.04540v2, 15 pp. (Mar. 2016).
Roddaro et al., "InAs nanowire hot-electron Josephson transistor," arXiv:1003.2140v1, 6 pp. (Mar. 2010).
Xiang et al., "Ge/Si nanowire mesoscopic Josephson junctions," *Nature Nanotechnology*, vol. 1, No. 3, pp. 208-213 (Dec. 2006).
Notice of Allowance issued in U.S. Appl. No. 16/252,230, dated May 13, 2020, 9 pages.
Aseev et al., "Selectivity Map for Molecular Beam Epitaxy of Advanced III—V Quantum Nanowire Networks," *Journal of Nano Letters*, 19:218-227 (Dec. 6, 2018).
Bietti et al., "Gallium surface diffusion on GaAs (001) surfaces measured by crystallization dynamics of Ga droplets," *Journal of Applied Physics*, 116:114311-1-114311-7 (Sep. 18, 2014).
Daweritz et al., "Reconstruction and defect structure of vicinal GaAs(001) and AlxGa1—xAs(001) surfaces during MBE Growth," *Journal of Surface Science*, 236:15-22 (Oct. 1, 1990).
Desplanque et al., "In-plane InSb nanowires grown by selective area molecular beam epitaxy on semi-insulating substrate,"Journal of Nanotechnology, 29, 27 pages (May 22, 2018).
Fadaly et al., "Observation of Conductance Quantization in InSb Nanowire Networks," Nano Letters, 17:6511-6515 (Jun. 30, 2017).
Ferguson et al., "RHEED intensity effects during the growth of InAs, InSb and in(As,Sb) by molecular beam epitaxy," *Journal of Crystal Growth*, 121:267-277 (Jul. 1992).
Fu, "Electron Teleportation via Majorana Bound States in a Mesoscopic Superconductor," available at http://arxiv.org/pdf/0909.5172v2, 5 pages (Jan. 20, 2010).
Gül et al., "Ballistic Majorana nanowire devices," available at http://arxiv.org/pdf/1603.04069v2, 19 pages (Dec. 21, 2017).
Gül et al., "Towards high mobility InSb nanowire devices," available at http://arxiv.org/pdf/1411.7285v2, 20 pages (May 8, 2015).
Hansen et al., "Mesoscopic decoherence in Aharonov-Bohm Rings," available at http://arxiv.org/pdf/cond-mat/0102096v2, 5 pages (May 8, 2001).
Hara et al., "Selective growth of InSb on localized area of Si(100) by molecular beam epitaxy," *Journal of Crystal Growth*, 323:397-400 (May 15, 2011).
Hiramatsu, "Epitaxial lateral overgrowth techniques used in group III nitride epitaxy," *Journal of Physics: Condensed Matter*, 13:6961-6975 (Jul. 26, 2001).
Jonker, "Interfacial contributions to magnetic thin film anisotropy arising from epitaxial growth processes in metal/semiconductor structures," SPIE, 2140:118-130 (May 11, 1994).
Kammhuber et al., "Conductance Quantization at zero magnetic field in InSb nanowires," available at http://arxiv.org/pdf/1603.03751v1, 16 pages (Mar. 11, 2016).
Kammhuber, "Spin-Orbit Interaction in Ballistic Nanowire Devices," Thesis of Delft University of Technology, 165 pages (2017).
Kanisawa et al., "Two-dimensional growth of lnSb thin films on GaAs(111)A substrates," *Applied Physics Letters*, 76:589-591 (Jan. 24, 2000).
Karzig et al., "Scalable Designs for Quasiparticle-Poisoning-Protected Topological Quantum Computation with Majorana Zero Modes," available at http://arxiv.org/pdf/1610.05289v3, 34 pages (Mar. 13, 2017).
Lutchyn et al., "Majorana zero modes in superconductor—semiconductor heterostructures" *Nature Reviews: Materials*, 3:52-68 (May 1, 2018).
Michel et al., "Molecular beam epitaxial growth of high quality InSb," *Applied Physics Letters*, 65:3338-3340 (Dec. 26, 1994).
Neave et al., "Dynamics of Film Growth of GaAs by MBE from Rheed Observations," *Applied Physics A: Solids Surfaces*, 31:1-8 (May 1, 1983).
International Search Report and Written Opinion issued in International Application No. PCT/US2020/012286, dated Mar. 24, 2020, 12 pages.
Plugge et al., "Majorana box qubits," *New Journal of Physics*, 19:1-14 (Jan. 11, 2017).
Schmid et al., "Template-assisted selective epitaxy of III-V nanoscale devices for co-planar heterogeneous integration with Si," *Applied Physics Letters*, 106, 14 pages (Jun. 8, 2015).
Schroder, "Semiconductor Material and Device Characterization: Third Edition," IEEE Press, 790 pages (Feb. 10, 2006).
Stevens et al., "Surface diffusion measurements of In on InGaAs enabled by droplet epitaxy," *Journal of Applied Physics*, 121:195302-1-195302-6 (May 16, 2017).
Vaitiekenas et al., "Selective Area Grown Semiconductor-Superconductor Hybrids: A Basis for Topological Networks," available at http://arxiv.org/pdf/1802.04210v3, 8 pages (Sep. 11, 2018).
Van Weperen et al., "Quantized Conductance in an InSb Nanowire," Nano Letters, 13:387-391 (Dec. 21, 2012).
Zhang et al., "Quantized Majorana Conductance," available at: http://arxiv.org/pdf/1710.10701, 26 pages (Oct. 29, 2017).

FABRICATION OF A DEVICE

TECHNICAL FIELD

This application relates to a method of fabricating a device and the resulting device.

BACKGROUND

Quantum computing is a class of computing in which inherently quantum mechanical phenomena, such as quantum state superposition and entanglement, are harnessed to perform certain computations far more quickly than any classical computer could ever be capable of. In a "topological" quantum computer, calculations are performed by manipulating quasiparticles—called "non-abelian anyons"—that occur in certain physical systems. Anyons have unique physical characteristics that distinguish them from both fermions and bosons. Non-abelian anyons also have unique properties with respect to abelian anyons. It is these unique properties that serve as a basis for topological quantum computing, in which information is encoded as a topological property of non-abelian anyons; specifically the braiding of their space-time worldlines. This has certain benefits over other models of quantum computation. One key benefit is stability, as the quantum braiding is unaffected by perturbations on a scale that could cause error-inducing quantum decoherence in other types of quantum computer.

Broadly speaking, to date, two types of physical system have been considered as potential hosts of non-abelian anyons, namely "5/2 fractional quantum Hall" systems in condensed matter physics, and (more recently) semiconductor-superconductor (SE/SU) nanowires. With regard to the latter, a key advance in the field was the realization that non-abelian anyons, in the form of "Majorana zero modes" (MZMs), can be formed in regions of semiconductor (SE) coupled to a superconductor (SU). Based on this phenomenon, a small network of SE/SU nanowires can be used to create a quantum bit, wherein each SE/SU nanowire comprises a length of semiconductor coated with a superconductor.

A quantum bit, or qubit, is an element upon which a measurement with two possible outcomes can be performed, but which at any given time (when not being measured) can in fact be in a quantum superposition of the two states corresponding to the different outcomes.

A "topological" qubit is a qubit implemented based on the above-mentioned technology of non-abelian anyons in the form of MZMs. A non-abelian anyon is a type of quasiparticle, meaning not a particle per se, but an excitation in an electron liquid that behaves at least partially like a particle. Particularly an anyon is a quasiparticle occurring in a two-dimensional system (two degrees of freedom in space). A Majorana zero mode is a particular bound state of such quasiparticles. Under certain conditions, these states can be formed in close to the semiconductor/superconductor interface in an SE/SU nanowire network, in a manner that enables them to be manipulated as quantum bits for the purpose of quantum computing. Regions or "segments" of the nanowire network between the MZMs are said to be in the "topological" regime.

SUMMARY

Whilst recent developments in fabrication technology have led to significant improvements in the quality of nanowire networks, the approaches in question are all facing challenges with quality.

Various micro/nanofabrication methods can be used to produce high-quality semiconductor (superconductor and insulating as well) structures required for quantum devices for potential use in the field of quantum computation. There are specific challenges in the case of epitaxial structures (in-plane wire networks) where a mask is used to guide the growth process, which may be kinetically or/and thermodynamically controlled.

Selective area growth (SAG) is a popular method used for growth of structures. For example, SAG of semiconductor systems is allowing scientists to realize structures needed for quantum computation which have many junctions of semiconductor nanowires. Realization of complex topological quantum networks requires highly uniform material properties not only along the nanowire but also across the junctions of intersecting nanowires. Due to fundamental epitaxial growth limitations, nanowire junctions can be prone to overgrowth caused by preferential nucleation at pattern crossings. This results in the formation of additional atomic planes and can lead to non-uniform material properties, which may be detrimental for computation with SAG systems.

Embodiments of the present invention provide methods of fabricating high-quality structures, e.g. nanowires, grown via selective area growth.

According to one aspect disclosed herein, there may be provided a method of fabricating a device, wherein the device comprises a plurality of lengths of material and at least one junction joining two or more of the lengths of material, and wherein the method comprises: in a masking phase, forming a mask on an underlying layer of the device, wherein the mask comprises a plurality of trenches exposing the underlying layer, each trench corresponding to one of said lengths of material, and wherein a respective section of each of two or more of said trenches either (a) narrows down, or (b) is separated by a discontinuity, at a position corresponding to the at least one junction; in a selective area growth phase, growing, by selective-area-growth, material in the set of trenches to form the lengths of material on the underlying layer; and joining the two or more lengths of material at the at least one junction.

By decreasing the width of the mask (i.e. the trenches of the mask) in the junction area compared to the rest of the mask (i.e. the body of the trenches), preferential nucleation at the junctions can be limited by the natural faceting and termination of the crystal growing in the narrower trenches. Alternatively, by placing empty spots in the mask at the junctions, undesired nucleation is limited. In this case there is little or no nucleation at the junctions, and the junction is formed by the merging of the grown lengths of material, e.g. via a conductive bridge across the discontinuity. The respective section of one or more of the trenches may, for example, be the ends of the trenches. Or, as another example, the respective section of one or more of the trenches may be a body portion of the trench, e.g. between the ends of trenches.

Normally, more material grows at the intersections or meeting of features (i.e. lengths of material) compared to a feature without an intersection. Embodiments of the invention use a modified mask pattern for selective area grown junctions through shape biasing to promote improved material and transport properties across junctions. In other words, the mask allows for uniform growth throughout the lengths of material and at the junctions (intersections, meeting, etc.).

Herein, a length of material refers to any structure that is grown in a corresponding trench (i.e. channel) of the mask. A length of material does not necessarily imply a straight line, although straight lines are not excluded. For example, multiple curved lines of material may be grown in corresponding curved trenches may be joined at a junction.

In embodiments, said joining may comprise merging by lateral growth of the material during the selective area growth phase.

Alternatively, said joining may comprise, in a subsequent phase to the selective area growth phase, connecting the two or more lengths of material via an electrical conductor.

In embodiments, the at least one junction may join only two or three of the lengths of material; thus forming a T-junction.

In embodiments, at least four of said lengths of material may be joined at the at least one junction, wherein a respective section of at least four trenches either (a) narrow down, or (b) are separated by a discontinuity, at a position corresponding to the at least one junction, and wherein said joining may comprise joining the at least four lengths of material at the at least one junction; thus forming a cross junction.

In embodiments, the device may comprise a plurality of junctions each joining at least some of the lengths of material, wherein two or more respective lengths of material are joined at each respective junction, wherein the mask comprises, for each respective junction, a respective set of two or more trenches corresponding to the two or more respective lengths of material, wherein a respective section of each of two or more respective trenches either (a) narrows down, or (b) is separated by a discontinuity, at a position corresponding to each respective junction, wherein said growing may comprise, growing, by selective-area-growth, material in the respective sets of trenches to form the two or more respective lengths of material on the underlying layer, and wherein said joining may comprise joining the two or more respective lengths of material at each respective junction.

In embodiments, the underlying layer may be an underlying layer of a wafer. In embodiments, the underlying layer may be a substrate of the wafer.

In embodiments, the plurality of trenches may be formed by etching the mask from the underlying layer. In embodiments, a pattern of the plurality of trenches may be defined by lithography. In embodiments, the mask may be an insulating mask. In embodiments, the mask may be a dielectric. In embodiments, the underlying layer may be an insulating material. In embodiments, the material may be a semiconductor. In embodiments, the material may be grown by epitaxy.

In embodiments, the method may comprise: in a superconductor growth phase, growing a layer of superconductor material over at least some of the lengths of material. In embodiments, the layer of superconductor material is applied using a particle beam. In embodiments, the superconductor material may be grown by epitaxy.

In embodiments, the device may be a quantum device and wherein the lengths of material may be nanowires.

According to another aspect disclosed herein, there may be provided a device comprising: a plurality of lengths of material and at least one junction joining two or more of the lengths of material; a mask formed on an underlying layer of the device, wherein the mask comprises a plurality of trenches exposing the underlying layer, each trench corresponding to a length of material, and wherein a respective section of each of two or more respective trenches either (a) narrows down, or (b) is separated by a discontinuity, at a position corresponding to the at least one junction, wherein the two or more lengths of material are joined over a part of the mask, and wherein the lengths of material comprise selective area grown material in the two or more trenches.

According to another aspect disclosed herein, there may be provided a method of operating the device, wherein the lengths of material are nanowires, and wherein the method comprises inducing at least one Majorana zero mode, MZM, in one or more nanowires, wherein the at least one MZM is induced by cooling the superconductor to a superconducting temperature and applying a magnetic field to the device. The inducing of the at least one MZM may further comprise gating the at least one of the one or more nanowires with an electrostatic potential.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

For a better understanding of the present technology, and to show how embodiments may be carried into effect, reference is made, by way of example only, to the following figures, in which.

DETAILED DESCRIPTION

Epitaxial semiconductor-superconductor materials are a promising platform for superconducting electronics and superconducting quantum computation. In the context of topological quantum computing, superconducting nanowires with strong spin-orbit coupling can support topological excitations that can serve as the basis for fault tolerant quantum information processing.

Current approaches to synthesize semiconductor-superconductor materials for superconducting nanowire electronics are either based on two-dimensional planar materials (see, e.g., Shabani et al. PRB 93, 155402 (2016)) or bottom up grown nanowire materials (see, e.g., Krogstrup et al. Nature Mater. 14, 400-406 (2015)).

Figure 3:
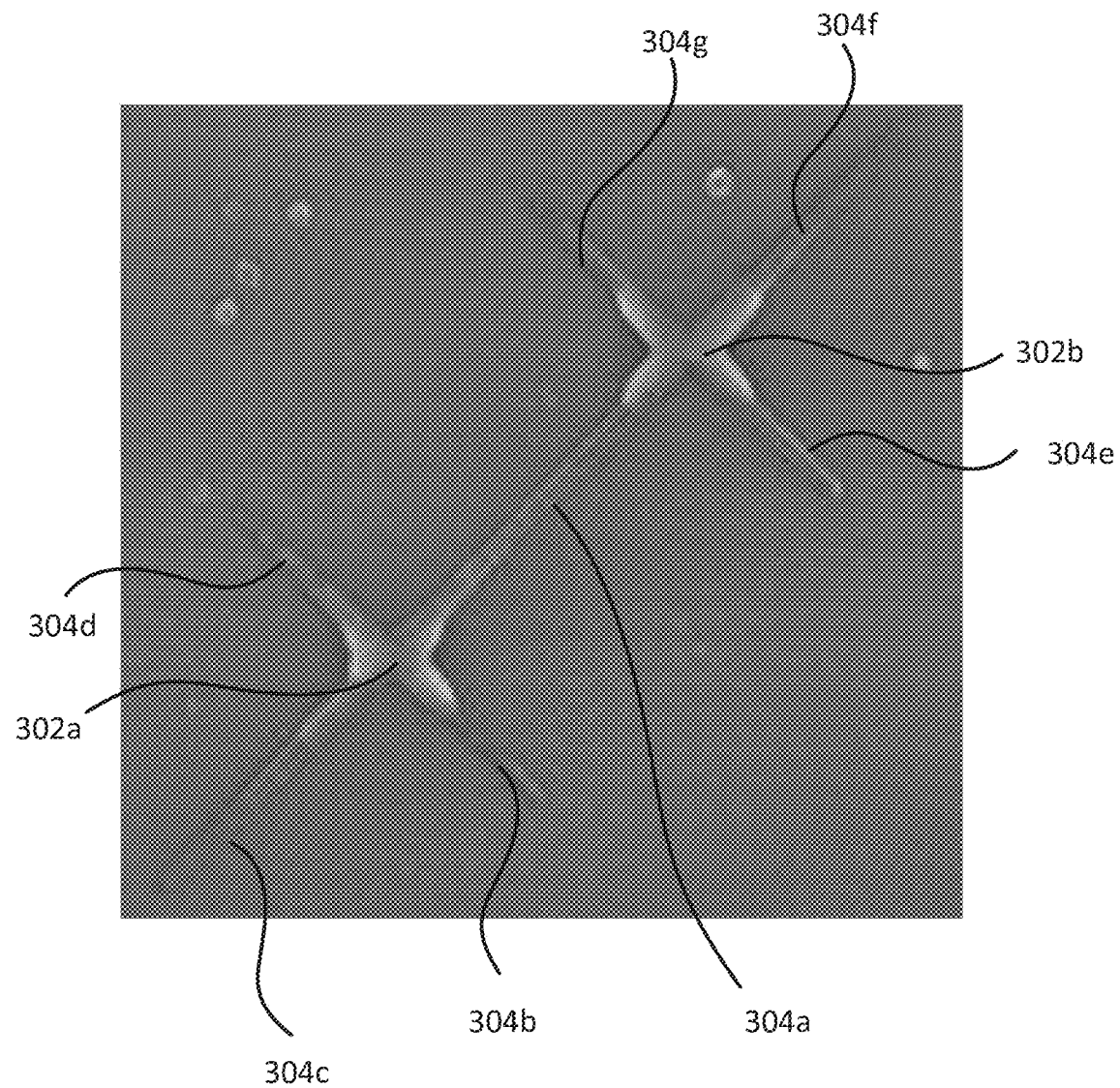
FIG. 3 shows an example image of overgrowth at junctions of a selective area grown semiconductor.

One problem with current techniques is the overgrowth of material at junctions of grown material. When structures, e.g. nanowires, are grown using SAG techniques, they tend to overgrow at the point where they meet, i.e. the junction of lengths of material. This junction, which may be an intersection, crossing, or meeting of several lengths of material, is often thicker in width than the rest of the lengths of material. In other words, the point where the lengths of material join is wider than the remaining part of the lengths of material. This non-uniform shape/geometry (e.g. thickness and/or width) of the material may have adverse effects on the resulting device that incorporates these structures. A scanning electron microscope image of overgrown junctions is shown in FIG. 3. Two junctions 302a, 302b are shown (intersecting junctions in this case), each junction joining four lengths of material 304a-304g. One of those lengths 304a forms part of each of the two junctions 302a, 302b.

To solve this and other problems, embodiments of the invention use a modified mask approach to fabricate a device, whereby the trenches of the mask in which material is grown is modified at the point where the grown material will be joined. The mask is either modified in that the trenches narrow down (i.e. they decrease in width) at the point corresponding to the junction, or the trenches are discontinuous (i.e. they are separated by a part of the mask) at the point corresponding to the junction. Once growth happens in the trenches, the lengths of material can be joined (e.g. merged). For example, the grown material may be joined by lateral extension of the material's crystal.

Figure 1:
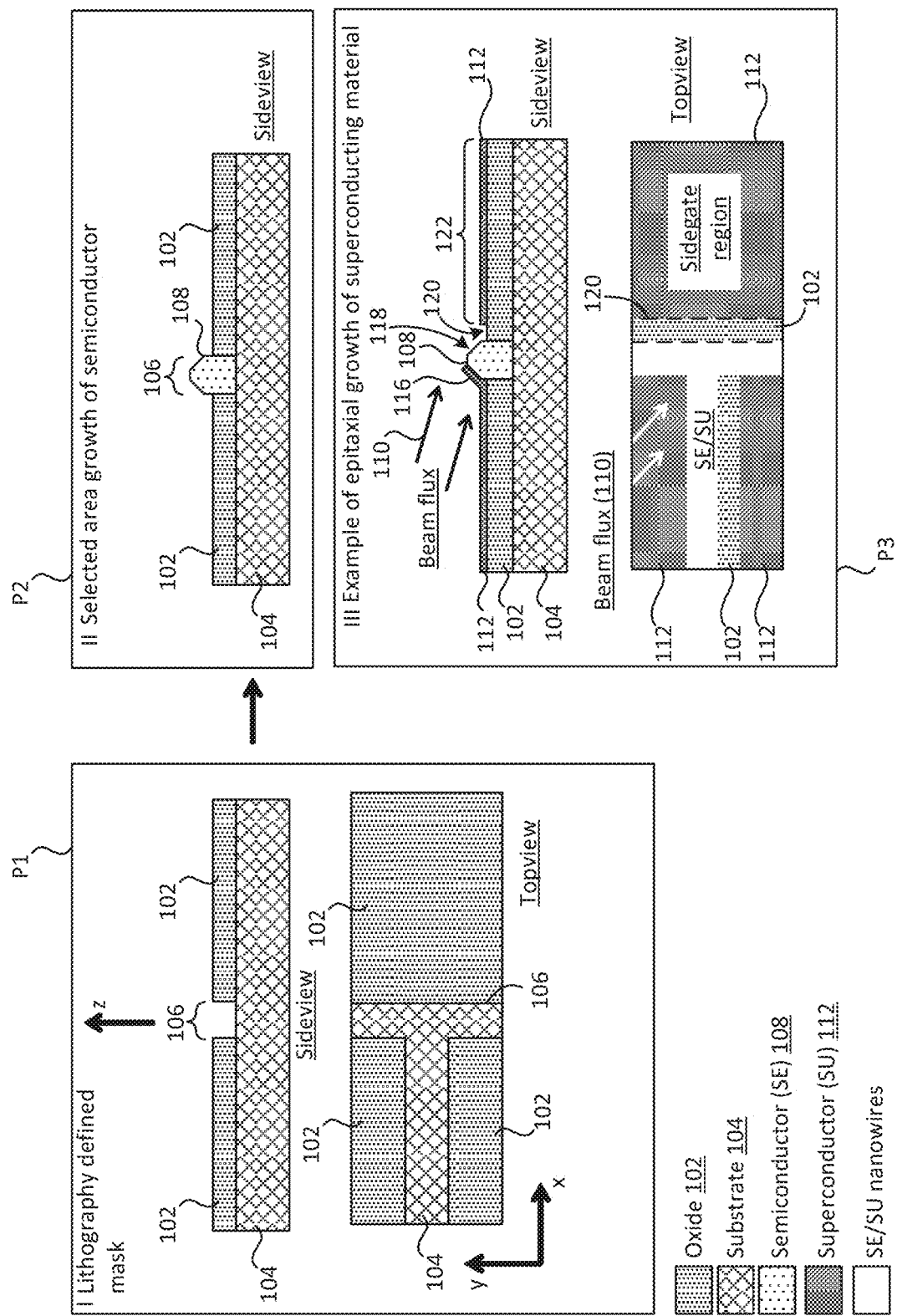
FIG. 1 illustrates schematically an example method for fabricating a network of nanowires.
Figure 5:
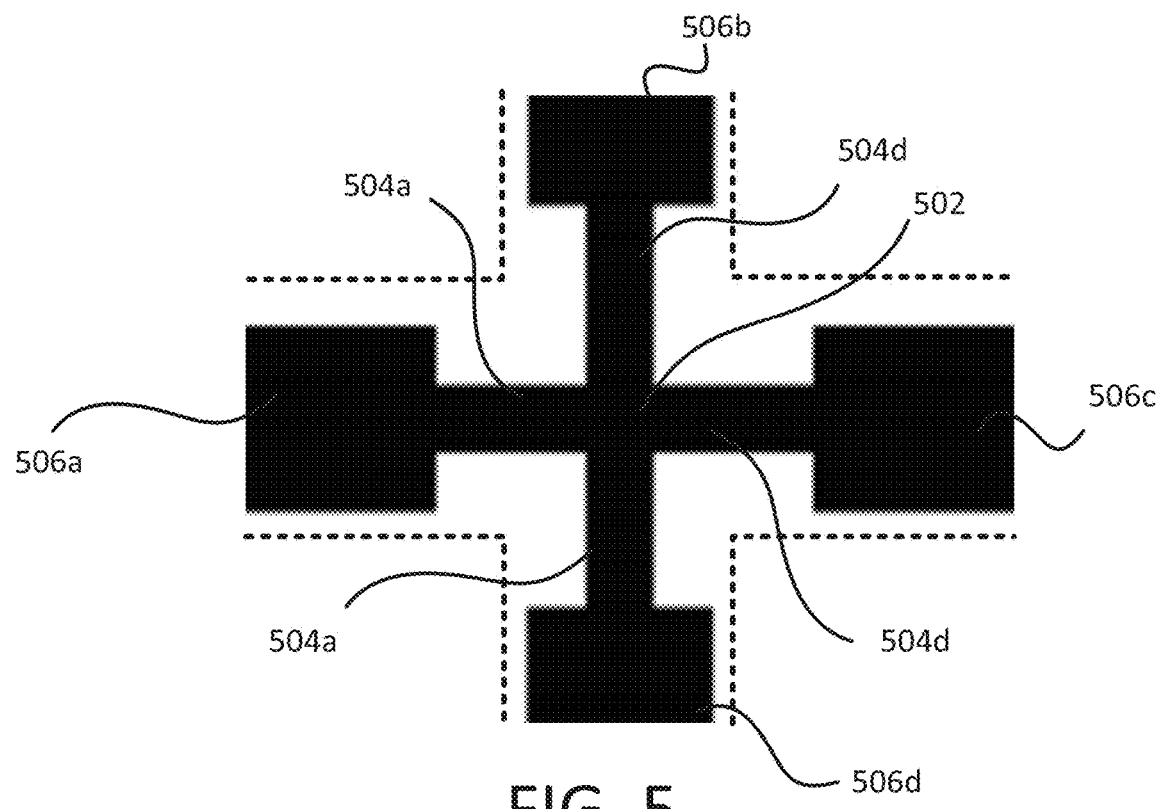
FIG. 5 illustrates schematically an example mask for growing lengths of material by selective area growth.

With reference to FIGS. 1, 5 and 5A, an example three-phase fabrication method will now be described. The fabrication method may be used to create device that has a plurality of lengths of material and one or more junctions. Each junction connects two or more lengths of material, as shown in FIG. 3. The fabrication method can be used to create a network of semiconductor (SE) and or semiconductor/superconductor (SE/SU) nanowires, which in turn can form the basis of a quantum device or circuit (e.g. for a quantum computer) or other mixed semiconductor-superconductor platform. In particular, the method is particularly suitable for fabricating a SE/SU nanowire network capable of hosting stable MZMs, which can form the basis of fault-free topological quantum computations. Here, an SE/SU nanowire refers to a semiconductor wire coated with a superconductor.

However, the method is not limited solely to the fabrication of nanowires. Embodiments of the invention may be used for the fabrication of any structure whereby material is grown via selective area growth. For example, the described techniques may be used for waveguides, e.g. in short range optical networks. An optical waveguide is a physical structure that guides electromagnetic waves in the optical spectrum, e.g. optical fibers. Alternatively, the techniques may be used to couple capacitive islands.

SAG is a growth method using crystal growth vacuum chambers such as, Chemical Beam Epitaxy (CBE), Molecular Beam Epitaxy, and MOCVD. See, e.g., G. J Davies *Proc. SPIE* 2140, Epitaxial Growth Processes, 58 (May 11, 1994); doi:10.1117/12.175795; M Fahed, Doctoral thesis: Selective area growth of in-plane III-V nanostructures using molecular beam epitaxy, 2016. http://www.theses.fr/2016LIL10114; Fukui et al, Appl. Phys. Lett. 58, 2018 (1991); doi: http://dx.doi.org/10.1063/1.105026.

Because the lengths of material are grown using SAG, an entire network of lengths (e.g. SE/SU nanowires) or multiple such networks can be fabricated as a whole on a substrate. The substrate (e.g. an insulating substrate) and the network can be incorporated directly into the final product, without any need to transfer the lengths to a different surface.

Fabrication of quantum devices involves building up a wafer through the deposition of multiple layers or material, usually in different patterns, over a substrate. The overall process involves multiple steps as the different layers are built up. For the following description, the "substrate" will be taken herein to refer to the base layer, and the "wafer" will refer to the substrate plus any other layers already deposited over the substrate at the current stage in the fabrication process.

In a first phase I (a masking phase), a mask 102 is formed on an underlying layer of a device (e.g. an underlying layer of a wafer 104). The mask may be an amorphous mask or an insulating mask (i.e. the insulating mask 102 may be made of an insulating material). The insulating material may be a dielectric material. The underlying layer of the wafer may be the substrate 104 itself, or it may be an intermediary layer of material that has been deposited on the substrate. The mask comprises a set of trenches that expose the underlying layer of the device, e.g. the substrate. The entirety of the mask may be formed at the same time, or the mask may be formed in stages.

Each trench of the mask corresponds to a length of material. In other words, material is grown in each trench to form a corresponding length of material, or put another way, each trench maps to a respective length of material. For example, each trench may correspond to a nanowire in the sense that a nanowire is formed in each trench. Here, a length of material does not imply any particular shape or size. Each trench may be the same shape and/or size, some trenches may be the same shape and/or size, or each trench may be a different shape and/or size.

Figure 4:
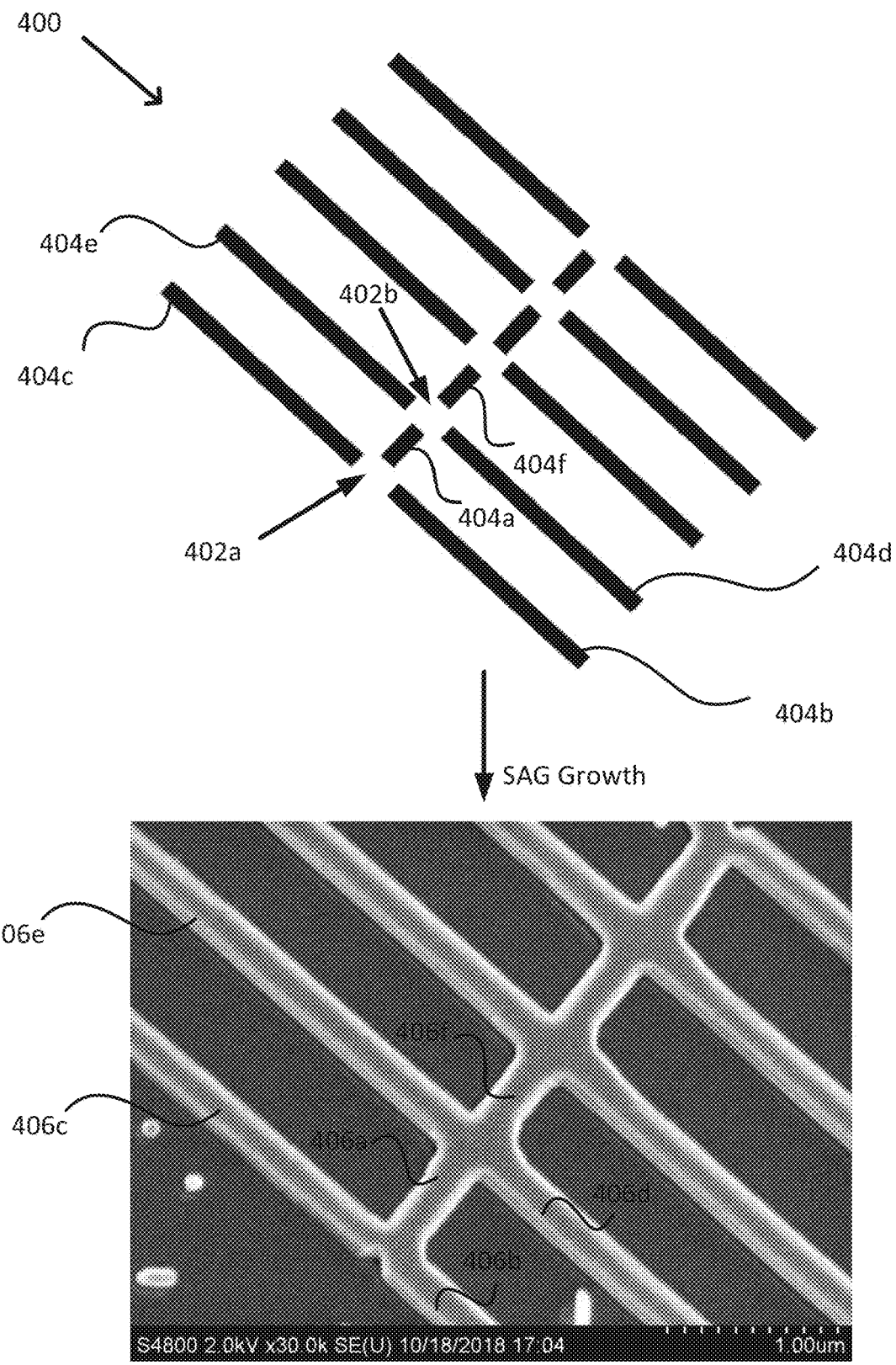
FIG. 4 illustrates schematically an example mask for growing lengths of material by selective area growth and an example image of nanowires that have grown in the example mask.

In some embodiments, the trenches are formed such that two or more trenches are separated by a discontinuity at a position corresponding to a junction. That is, a respective section of two or more trenches are separated by a portion of the mask. Put another way, at least one trench may have at least one open end that is not joined to (or is separated from) any other trench, and those open ends are positioned at a junction of the trenches. The discontinuity (i.e. separation) may be on the order of a few nanometres. The two or more trenches may be positioned such that the lengths of material grown in those trenches will form a T-junction once joined. An example of a T-junction 402a formed from three lengths of material 404a, 404b, 404c is shown in FIG. 4. The T-junction 402a is formed by growing material in three corresponding trenches 406a, 406b, 406c in a mask 400. As shown, the three corresponding trenches are separated by a discontinuity 408a.

In some embodiments, the trenches are formed such that at least four trenches are separated by a discontinuity at a position corresponding to a junction. That is, a respective section of at least four trenches are separated by a portion of the mask. The portion of the mask asks as an initial barrier between the open ends of the trenches. The at least four trenches may be positioned such that the lengths of material grown in those trenches will form a cross junction once joined, i.e. once the four lengths of material are grown and joined it will appear as if two longer lengths of material are intersecting one another at the junction. An example of a cross junction 402b formed from four lengths of material 404a, 404d, 404e, 404f is also shown in FIG. 4. The cross junction 402b is formed by growing material in four corresponding trenches 406a, 406d, 406e, 406f in the mask 400. As shown, the four corresponding trenches are separated by a discontinuity 408b.

The mask may comprise a single set of two or more trenches separated by a discontinuity (i.e. a portion of the mask). Alternatively, the mask may comprise multiple sets of two or more trenches, each separated by a respective discontinuity (i.e. a respective portion of the mask). The trenches may be formed such that they do not overlap, i.e. they do not overlap in space or cover the same area of the underlying layer.

In alternative embodiments, the trenches of the mask are formed such that a respective section of two or more trenches narrow down at a position corresponding to a junction. That is, as the trenches approach the position corresponding to the junction, the trenches decrease in width. In other words, where a respective portion of the three trenches at the position of the junction is thinner (i.e. narrower) than a respective body portion of the three trenches. Preferably, the trenches are the same thickness (i.e. in the direction perpendicular to the plane of the substrate) as one another, both at their widest point and at their narrowest point. However, this is not essential. An example of this shape biasing is shown in FIG. 5. Here, four trenches meet at a junction 502. Each trench is narrower at a junction 502 than at a portion of the trench that is not at the junction. For instance, each trench may have a first end 504a-d, a second different end, and a body portion 506a-d between the first and second ends. The first ends 504 of the two or more trenches meet at the junction 502. At least the respective first ends 504 of the two or more trenches are narrower than the body portion 506 of the respective trenches. One or more of the trenches may form a respective second, different junction at their second ends in the same manner.

Figure 7:
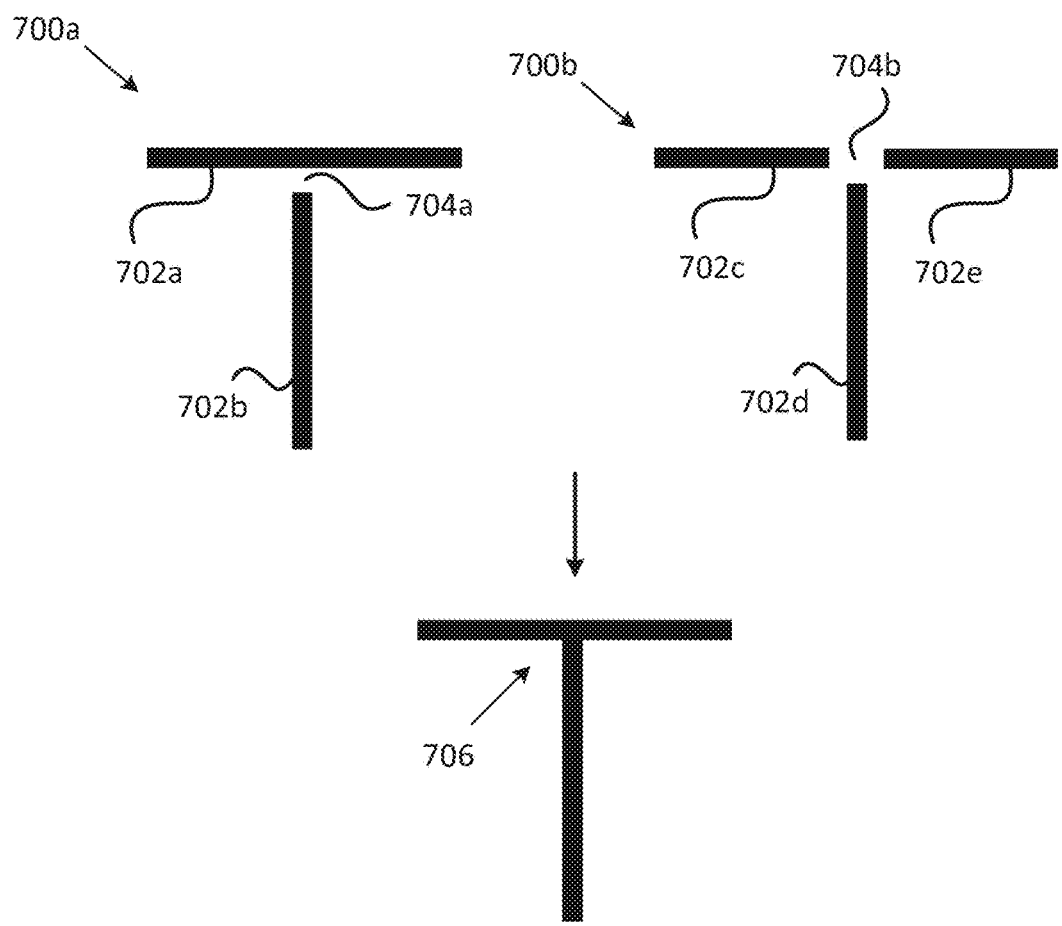
FIG. 7 illustrates schematically two example masks for growing a T-junction.

FIG. 7 illustrates example masks which may be used to fabricate a device. A first example mask 700a comprise two trenches 702a, 702b in which two corresponding lengths of material may be grown. The two trenches are separated by a discontinuity 704a. The discontinuity separates a section (i.e. an end) of one trench from a section (i.e. a body portion) of the other trench. The two lengths of material grown in the two trenches may be joined to form a junction 706. In this case, a T-junction (i.e. T-shaped) will be formed. A second example mask 700b comprise three trenches 702c, 702d, 702e in which three corresponding lengths of material may be grown. The three trenches are separated by a discontinuity 704b. The discontinuity separates a section (i.e. an end) of each trench from a section (i.e. an end) of the other trenches. The three lengths of material grown in the three trenches may be joined to form a junction 706.

Figure 8:
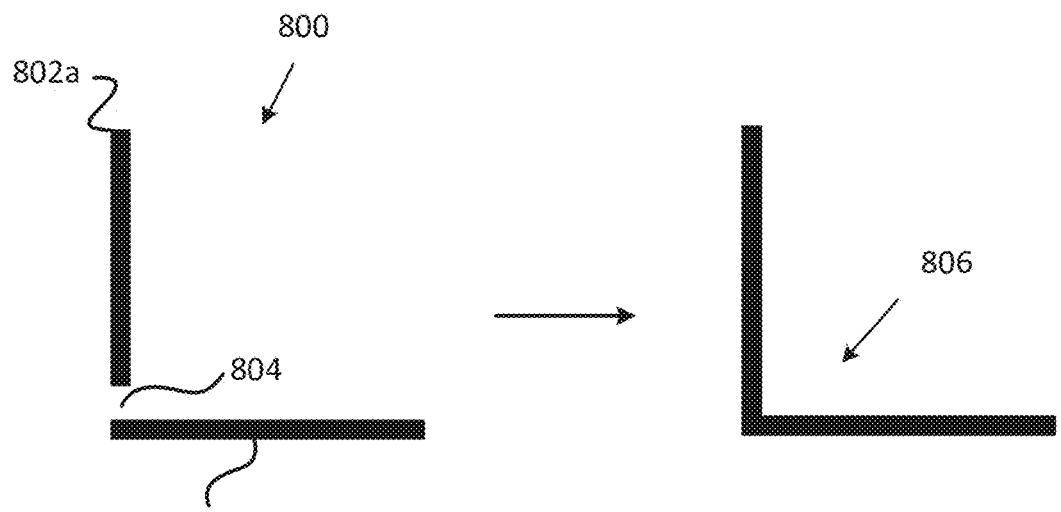
FIG. 8 illustrates schematically an example mask for growing an L-junction.

FIG. 8 illustrates an example mask which may be used to fabricate a device. The mask 800 comprises two trenches 802a, 802b in which two corresponding lengths of material may be grown. The two trenches are separated by a discontinuity 804. The discontinuity separates a section (i.e. an end) of one trench from a section (i.e. an end) of the other trench. The two lengths of material grown in the two trenches may be joined to form a junction 806. In this case, an L-junction (i.e. L-shaped) will be formed.

In the example of FIG. 1, a patterned layer of insulating material 102 (insulating mask) is formed on top of an insulating substrate 104. In this example, the substrate is the underlying layer of the wafer, which may the underlying layer of the device. A side-view and a top-view of the substrate 104 with the insulating mask 102 are shown on the left hand side of FIG. 1. The substrate 104 can be formed of any suitable substrate material such as InP (Indium Phosphide), and is an insulating substrate in the described examples. In the described examples, the insulating material 102 is an oxide but it can be any insulating (e.g. dielectric) material that facilitates SAG in a second phase II of the fabrication method (see below).

The insulating mask or oxide layer 102 is patterned in that the oxide layer 102 is formed so as to leave trenches (or narrow strips) of the substrate—in a desired region 106—exposed (i.e. not covered by the mask 102). The pattern in this context refers to the structure of the desired region 106, which will ultimately become the structure of the nanowire network, as it is this exposed region 106 in which semiconductor (SE) nanowires are grown. Accordingly, the size and structure of the nanowires matches the size and structure of the exposed region 106. Although only one exposed region 106 is shown in FIG. 1, material (e.g. nanowires) can be grown simultaneously in multiple regions and all description pertaining to the desired region 106 applies equally to multiple such regions. Accordingly, the structure of an entire nanowire network can be defined by the structure of the exposed region(s), which are themselves defined by the structure of the trenches of the mask. In this example, the strips and hence the resulting nanowires have a width of the order of tens or hundreds of nanometers.

The insulating mask 102 can be formed so as to leave the desired region 106 exposed in any suitable manner. For example, a uniform, continuous layer of a dielectric such as an oxide can be deposited on the substrate 104 or other underlying layer, and the exposed region 106 can then be formed by selectively etching away the insulating mask 102 from the desired region 106 (in this case, it is the etching that defines the eventual nanowire network structure). As another example, the insulating material 102 can be selectively deposited on the substrate 104 with a mask used to prevent deposition of the material (e.g. oxide) 102 in the desired regions 106 (in this case, it is the mask that defined the eventual nanowire network structure). The oxide 102 may for example be silicon oxide ($SiO_x$). More generally any suitable dielectric or other insulator could be used.

In a second phase II (a semiconductor growth phase, or a SAG phase), material 108 is grown in the trenches exposing the underlying layer of the wafer. In the case where the underlying layer is the substrate itself, the material 108 is grown on the exposed portions of the substrate. Growth of the material is initiated in each set of trenches. Growth may be initiated at the same time or at different times. For example, growth may be initiated in a first set of trenches and then, later, initiated in a second, different set of trenches. The material may be a semiconductor. In that case, the selective-area-grown semiconductor material forms a network of nanowires.

Referring back to the example of FIG. 1, material 108 (e.g. semiconductor material) is selectively grown within the desired regions 106, on top of the exposed portion of the substrate 104. An example is illustrated at the top right of FIG. 1, at which a side-view of the substrate 104 is shown. Due to the patterning of the mask 102, the selectively grown semiconductor 108 forms in-plane nanowires (that is, nanowires lying in the place of the substrate 104). The semiconductor material 108 may for example be Indium Arsenide (InAs), Indium Antimonide (InSb), or any other semiconductor with relatively large spin orbit and G-factor. The SAG semiconductor 108 can for example be confined 2DEG (two-dimensional electron gas) semiconductor heterostructure or single material semiconductor.

SAG is a growth method using crystal growth vacuum chambers. SAG refers to localized growth of material in exposed regions of the substrate, with growth conditions selected to prevent such growth on the mask itself. This can be based on Chemical Beam Epitaxy (CBE), Molecular Beam Epitaxy (MBE), or Metal-Organic Chemical Vapour Deposition (MOCVD), for example. In the context of semiconductors, SAG may refer to a class of epitaxial semiconductor growth (and is also referred to as selective area epitaxy), in which a patterned insulating mask is used to define the intended structure of the semiconductor material to be grown (a form of lithography). Epitaxy refers to a technique whereby a second crystal is grown on a first crystal using the first as a seed crystal. In SAG, the process is tuned such that semiconductor growth occurs only on regions of the substrate that are not covered by the insulating mask 102, and not on the insulating mask itself, e.g. not on the dielectric mask. This is different from other deposition/growth processes, such as bottom up growth (in which no mask is used) and uniform deposition (epitaxial or otherwise) in which material is uniformly deposited across a surface irrespective of its material composition (as in phase III—see below). SAG may be conducted in a high or ultra-high vacuum, and may require careful tuning to achieve the desired selective semiconductor growth.

Any suitable SAG process can be used in the second phase II to create the desired lengths of material, e.g. the SE nanowires in the exposed region 106. The SAG nanowires are defined along high symmetry in-plane crystal orientations on the substrate, which also gives well-defined faceting of the nanowires. This makes the SU/SE interface flat, potentially atomically flat, and well defined.

SAG per-se is known, and is therefore not discussed in further detail herein. For further description of SAG, see for example the above-cited references by G. J. Davies, M Fahed, and Fukui et al.

Suffice it to say that the selective area growth phase is such that, at the end of that phase, the material 108 fills the desired region 106 (that is, the regions 106 in which the underlying layer or substrate 104 is not covered by the mask 102). In some cases it may extend outwardly in a direction normal (perpendicular) to the plane of the underlying layer or substrate 104 (z-direction hereafter) so as to protrude outwardly of the mask 102. That is, the semiconductor material 108 extends a greater distance from the underlying layer or substrate 104 than the mask 102 in the z-direction. In this manner, the semiconductor material 108 forms nanowires lying substantially in the plane of the underlying layer or substrate 102 (in-place nanowires).

Figure 6:
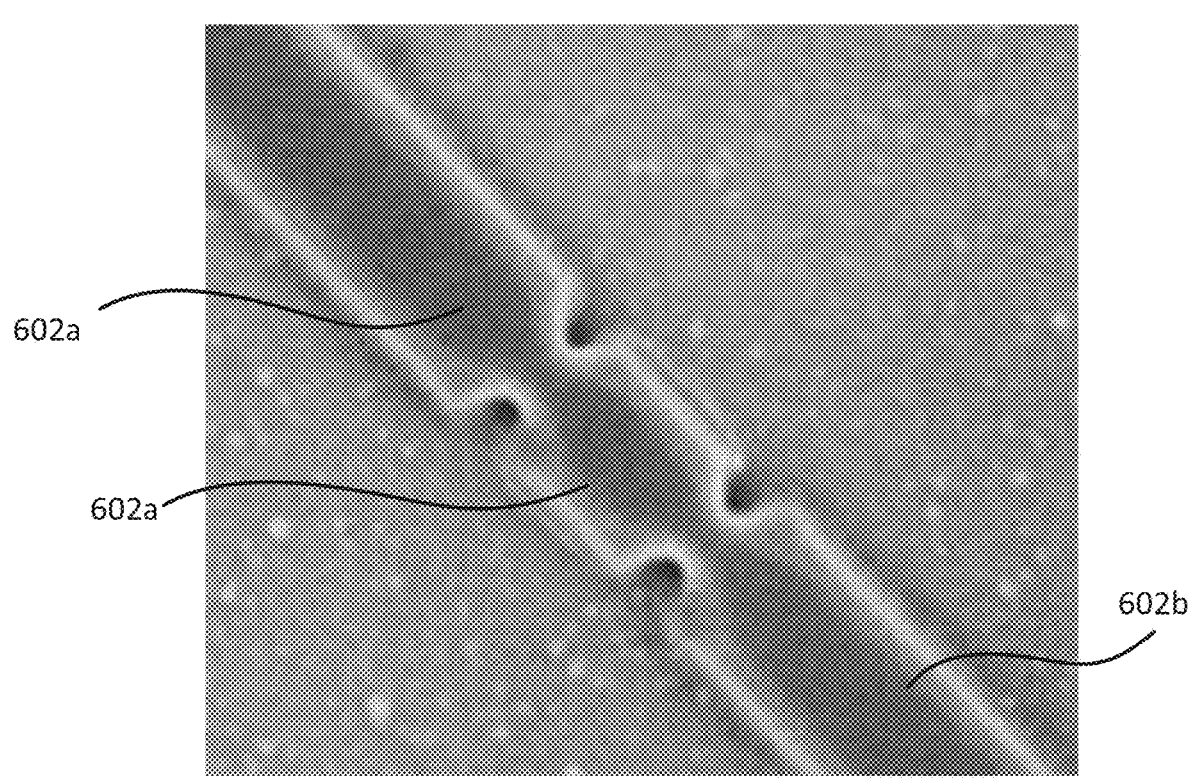
FIG. 6 illustrates an example image of nanowires that have merged over an empty spot in a mask.

Once the two or more lengths of material are formed via SAG, they are joined to form a junction. Similarly, four lengths of material may be joined to form a junction. In some embodiments, the joining is part of the SAG phase. The lengths of material merge by lateral growth of the material's crystal. That is, the joining of the lengths of material (e.g. nanowires) may occur naturally during (or at the end of) the SAG phase. In the case that the trenches are separated by a discontinuity, the previously separated open ends of the trenches extend laterally to merge with one another. I.e. they grow over the portion of the mask that separates the lengths of material. An example of this phenomenon is shown in FIG. 6. Here, as proof of concept, two lengths of material 602a, 602b are shown during their merger at a junction 604.

Alternatively, the lengths of material may be joined after the SAG phase (but before any superconductor growth phase, if any). The lengths of material may be connected using an electrical conductor, e.g. a metallic lead or material. That is, the open ends of the separated trenches are connected with an electrically conductive material. The electrical conductor may act as a semiconductor bridge, bridging the separated lengths of semiconductor material.

However the lengths of material are joined, they are joined over the mask. That is, the lateral extension of the (semiconductor) material causes the material to grow over the portion of the mask that acts as a barrier between the separated trenches, e.g. open-ended trenches. Alternatively, an electrical conductor is placed over the portion to connect the separated trenches.

In an optional third phase III (a superconductor growth phase) a layer of superconducting (SU) material 112 may be grown over at least part of the network of lengths of material, e.g. the nanowire network. In the example of FIG. 1, the layer of superconducting material is grown using a particle beam 110. Herein, a superconducting material means a material that exhibits superconducting properties at least under certain conditions. An example of such a material is aluminum (Al). Alternatively the superconductor material 112 could be niobium (Nb), titanium nitride (TiN), or any other superconductor. In the following examples, the superconductor is grown epitaxially in phase III, and the superconductor growth phase III may be referred to as an epitaxial growth phase in this context. However, the technology is not limited in this respect, and it may be possible to achieve the intended result via non-epitaxial superconductor growth in phase III.

The superconducting material 112 can be grown in phase III using molecular beam epitaxy (MBE) electron gun epitaxy, for example.

At least part of the superconductor layer 112 is deposited on top of the lengths of material such that this part of the superconductor layer 112 (labelled 116 in FIG. 1) is in direct contact with the SE 108 of the nanowire. That is, such that the semiconductor 108 of the nanowire is at least partially covered with superconducting material.

This is also a form of epitaxy, but it is not SAG. In particular, in the epitaxial growth phase III, epitaxial growth does occur on the mask (or dielectric layer) 102, as well as on the SE 108 of the nanowires.

In one possible technique, the beam can be angled in substantially the z-direction (the direction perpendicular to the plane of the substrate) such that essentially all of the exposed surfaces of the mask 102 and the SE material 108 are covered by the SU layer 112. However, in another example as illustrated, the particle beam 110 is incident on the substrate 104 with a non-zero angle of incidence relative to the z-direction (deposition angle). As a consequence of this non-zero deposition angle and the protruding structure of the SE core 108 of the nanowire, the SE of the nanowire is only partially coated by the superconductor layer 112; that is, a part of the SE nanowire core (labelled 118) is not coated by the superconductor material. The bulk of the insulating mask 102 is also coated by the superconductor layer 112, however due to the angle of the incoming beam 110 and the protruding structure of the SE nanowire cores 108, small regions of the insulating mask 102 (shadow regions) immediately adjacent the protruding SE nanowires 108 are left exposed, i.e. not coated by the SU material. One such shadow region is labelled 120 in FIG. 1. The shadow region 120 separates the SE material 108 from a portion of the SU layer 112 in a "side gate" region 122. The portion of the SU layer 112 in the sidegate region 122 can be used to form a gate for controlling the nanowires, or (more likely) the SU material can be etched away from this region and replaced with a more suitable gate material. Either way, the shadow gap 120 ensures the gate operates as intended. Forming the gap 120 using such "in-situ" patterning in the SU epitaxy phase III (as described above) ensures that material does not need to be etched away too close to the delicate nanowires 108.

The SAG phase II and superconductor growth phase III can be conducted in a vacuum chamber, preferably without moving the substrate 104 between phases. These phases can be carried out under high vacuum or ultra-high vacuum conditions (~10-8-10-12 Torr or less), and those vacuum conditions may be maintained between phases. Among other things, this ensures a clean SE/SU interface, free from unwanted impurities.

Both the SAG phase and the superconductor growth phase may require carefully calibrated conditions to get within respective "growth windows" for these two phases, and thereby achieve the desired (semiconductor) material growth and superconductor material growth respectively. The growth conditions, temperature and flux are chosen dependent on the material type. For example, for MBE (which can be used in both the SAG phase II and superconductor growth phase III) the substrate is generally heated to temperatures of around 500° C. or more to clean the surface for native oxide. However, in the SAG growth phase II and SU growth phase III, the respective temperature windows in which the desired growth takes place is dependent on the composition of the SE material 108 and SU material 112 respectively. The superconductor may be grown/deposited in-situ, without breaking vacuum. In this way the surface of SAG is not oxidized in air and remain clean until the SU is put on, which ensure a clean SE-SU interface.

The substrate (or underlying layer of the wafer) 104 and mask 102 on which the SE/SU nanowire network is grown can be incorporated in the end-product, such as a quantum circuit or quantum computer, along with the SE/SU nanowire network, without transferring the nanowires from the substrate on which they were originally fabricated.

Figure 2:
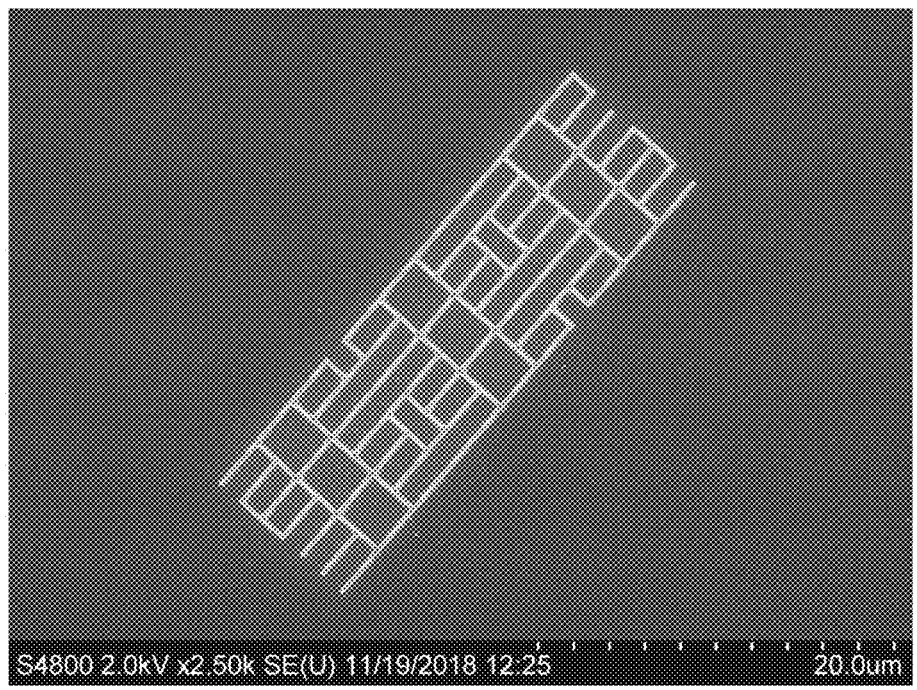
FIG. 2 shows a top view scanning electron microscope image of a selective area grown InAs nanowire network on a GaAs substrate.

Embodiments of the disclosed technology include topologically protected quantum computing circuits that comprise networks of nanowires formed using such mixed semiconductor and superconductor regions. In FIG. 2, for instance, a wire-pattern consisting of InAs nanowires grown on an insulating GaAs substrate is shown. In particular, FIG. 2 shows the fabrication of a complicated network based on a one-dimensional nanowire network.

As noted above, the selective area growth (SAG) of nanowire networks can be used to produce Majorana-based topological qubits, which utilize the formation of superconducting islands, some parts of which are topological (T) and some parts of which are non-topological (e.g., conventional s-wave (S)). SAG techniques can provide a high degree of control over the shape of the produced devices, and thus are useful in producing the components used in scalable topological quantum computation. In example embodiments, one or more Majorana zero modes, MZM, may be induced in at least one nanowire (i.e. length of material) of the nanowire network by cooling the superconductor to a superconducting temperature and applying a magnetic field to the device.

The examples described herein are to be understood as illustrative examples of embodiments of the invention. Further embodiments and examples are envisaged. Any feature described in relation to any one example or embodiment may be used alone or in combination with other features. In addition, any feature described in relation to any one example or embodiment may also be used in combination with one or more features of any other of the examples or embodiments, or any combination of any other of the examples or embodiments. Furthermore, equivalents and modifications not described herein may also be employed within the scope of the invention, which is defined in the claims.

The invention claimed is:

1. A method of fabricating a device, wherein the device comprises a plurality of lengths of material and at least one junction joining two or more of the lengths of material, and wherein the method comprises:

in a masking phase, forming a mask on an underlying layer of the device, wherein the mask comprises a plurality of trenches exposing the underlying layer, each trench corresponding to one of said lengths of material, and wherein a respective section of each of at least two of said trenches either (a) narrows down, or (b) is separated by a discontinuity, at a position corresponding to the at least one junction;

in a selective area growth phase, growing, by selective-area-growth, material in the set of trenches to form the lengths of material on the underlying layer; and joining the two or more lengths of material at the at least one junction.

2. The method of claim 1, wherein said joining comprises merging by lateral growth of the material during the selective area growth phase.

3. The method of claim 1, wherein said joining comprises, in a subsequent phase to the selective area growth phase, connecting the two or more lengths of material via an electrical conductor.

4. The method of claim 1, wherein the at least one junction joins only two or three of the lengths of material; thus forming a T-junction.

5. The method of claim 1, wherein at least four of said lengths of material are joined at the at least one junction, wherein a respective section of each of least four trenches either (a) narrows down, or (b) is separated by a discontinuity, at a position corresponding to the at least one junction, and wherein said joining comprises joining the at least four lengths of material at the at least one junction; thus forming a cross junction.

6. The method of claim 1, wherein the device comprises a plurality of junctions each joining at least some of the lengths of material, wherein two or more respective lengths of material are joined at each respective junction, wherein the mask comprises, for each respective junction, a respective set of two or more trenches corresponding to the two or more respective lengths of material, wherein a respective section of each of the two or more respective trenches either (a) narrows down, or (b) is separated by a discontinuity, at a position corresponding to each respective junction, wherein said growing comprises, growing, by selective-area-growth, material in the respective sets of trenches to form the two or more respective lengths of material on the underlying layer, and wherein said joining comprises joining the two or more respective lengths of material at each respective junction.

7. The method of claim 1, wherein the underlying layer is an underlying layer of a wafer.

8. The method of claim 1, wherein the underlying layer is a substrate of the wafer.

9. The method of claim 1, wherein the plurality of trenches are formed by etching the mask from the underlying layer.

10. The method of claim 1, wherein a pattern of the plurality of trenches is defined by lithography.

11. The method of claim 1, wherein the mask is an insulating mask.

12. The method of claim 1, wherein the mask is a dielectric.

13. The method of claim 1, wherein the underlying layer is an insulating material.

14. The method of claim 1, wherein the material is a semiconductor.

15. The method of claim 1, wherein the material is grown by epitaxy.

16. The method of claim 1, comprising:
   in a superconductor growth phase, growing a layer of superconductor material over at least some of the lengths of material.

17. The method of claim 16, wherein the layer of superconductor material is applied using a particle beam.

18. The method of claim 16, wherein the superconductor material is grown by epitaxy.

19. The method of claim 1, wherein the device is a quantum device and wherein the lengths of material are nanowires.

\* \* \* \* \*